United States Patent

[11] 3,600,695

[72] Inventor Friedrich Johann Kraussor
Jericho, N.Y.

[21] Appl. No. 679,119
[22] Filed Oct. 30, 1967
[45] Patented Aug. 17, 1971
[73] Assignee Emerson Electric Co.

[54] POWER AMPLIFIER WITH OVERLOAD PROTECTION
3 Claims, 2 Drawing Figs.

[52] U.S. Cl. 330/11, 330/24, 330/15
[51] Int. Cl. H03f 21/00, H03f 3/10, H03f 3/26
[50] Field of Search 330/119, 120, 121, 11 P, 24, 15, 119, 30, 69, 624, 84, 81, 110; 307/202

[56] References Cited

UNITED STATES PATENTS

| | | | |
|---|---|---|---|
| 2,713,620 | 7/1955 | Tilley | 330/120 X |
| 3,346,818 | 10/1967 | Price | 330/30 |
| 3,187,267 | 6/1965 | Merington | 330/110 |

*Primary Examiner*—Nathan Kaufman
*Attorney*—Henry L. Burkitt

ABSTRACT: A transistor push-pull power amplifier, adapted to be connected to a loudspeaker, includes driver transistors and output power transistors. A shunt arm, preferably including a Zener diode and a reversely poled high-speed diode, is connected between the base of each driver transistor and the loudspeaker. In the event of an overload, the shunt arms prevent excess current from harming the transistors of the amplifier.

Figure 1:
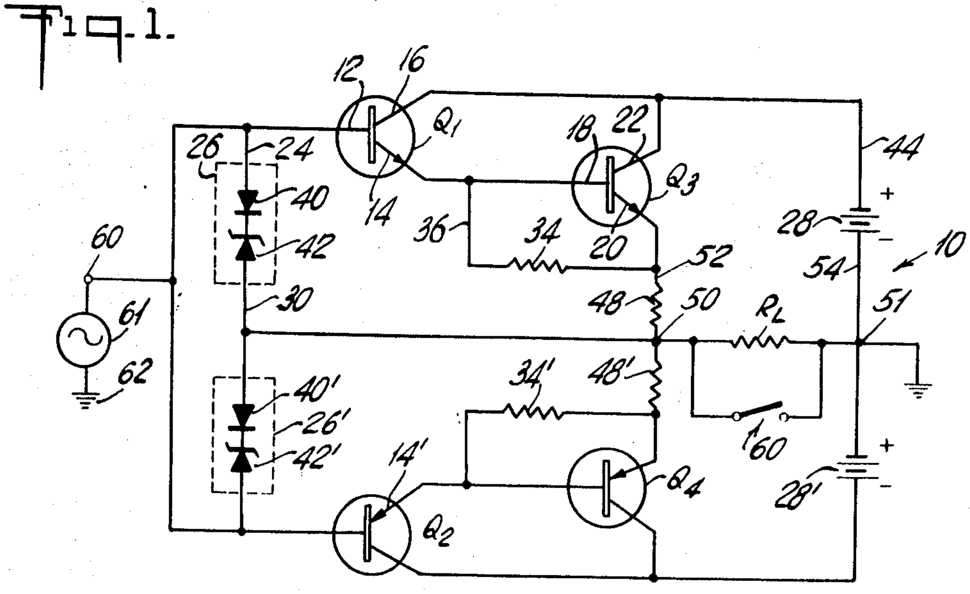

INVENTOR
FRIEDRICH J. KRAUSSER
BY Henry L. Burkitt
ATTORNEY

POWER AMPLIFIER WITH OVERLOAD PROTECTION

DESCRIPTION

This invention relates generally to transistor amplifiers and more particularly to a means for overload protection of such amplifiers.

Transistor power amplifiers present many advantages when used in high-fidelity sound systems. Compared to amplifiers using electron tubes, they are reliable, do not require a warmup period, and do not produce appreciable heat. However, such amplifiers may be damaged by overload conditions. An overload condition may occur if the user of the equipment incorrectly connects the two leads from the amplifier to each other, causing a short. An overload may also occur if the input signal to the amplifier is too large, for example during a loud musical passage, i.e., a high level transient signal.

Other possible causes of overload conditions are the use of a loudspeaker having a lower impedance than the impedance rating of the amplifier, or driving an amplifier at maximum levels of output power at elevated ambient temperatures.

When overload conditions exist, excessive currents flow through the transistor amplifier and, in particular, through the driver and power output stages of the amplifier. Accordingly, the driver and power output transistors frequently burn out and must be replaced. Such replacement requires the time of a skilled repairman.

One conventional solution to this problem has been to put a fuse in series with the emitter of each output transistor of the amplifier. For example, a 10-watt amplifier may use two 1/2-Amp. fuses (of type AGC or 3AG) in series with its two output transistors. Fuses are relatively slow in response to overload, often slower than the one-twentieth of a second in which a transistor may be ruined. In addition, a fuse may be difficult to replace, particularly by an inexperienced customer. A circuit breaker may likewise be too slow to prevent damage to the transistors of the amplifier.

Accordingly, it is an objective of the invention to provide protection means for protecting a transistor amplifier when an overload condition exists.

Another objective of the present invention is to provide an amplifier circuit having overload protection means which means is reliable and quick-acting and does not need to be replaced after an overload occurs.

In furtherance of the above objections, a push-pull amplifier utilizing the protection circuit of the present invention includes a first section, which amplifies positive signals, and a second section, which amplifies negative signals. EAch section may include a driver stage transistor which drives an output power transistor, a power transistor preferably being connected between the collector and emitter electrodes of each of the driver transistors. A source of current may be connected with the emitters of each of the transistors. In each section, an impedance is connected, preferably in series, with the driver transistor's emitter electrode and the output circuit. In each section, a shunt arm, including preferably a Zener diode and a second diode reversely poled in respect to the Zener diode, is connected to the junction of the impedance and the output circuit and to the base electrode of each of the driver transistors.

When an overload condition exists, the current flowing through the emitter electrodes of the driver and output transistors of each section of the amplifier starts to increase. At a predetermined voltage, the Zener diode shunt arms provide low resistance paths for the base currents so that portions of the base currents are shunted around the transistors. Thus, the driver and output transistors are protected from excessive currents which may interfere seriously with the continued operation of the amplifier.

Other objectives of the invention will be set forth hereinafter, or will be apparent from the description and the drawings, in which are illustrated an embodiment exemplifying the invention.

The invention, however, is not intended to be restricted to any particular construction, or any particular arrangement of parts, or any particular application of any such construction or arrangement of parts, or any specific method of operation or use, or any of the various details thereof, even where specifically shown and described herein, as the same may be modified in various particulars or may be applied in many varied relations, without departing from the spirit and scope of the claimed invention, of which the exemplifying embodiment herein shown and described is intended only to be illustrative, and only for the purpose of complying with the requirements of the Statutes for disclosure of am operative embodiment, but not to show all the various forms and modifications in which the invention might be embodied.

Figure 2:
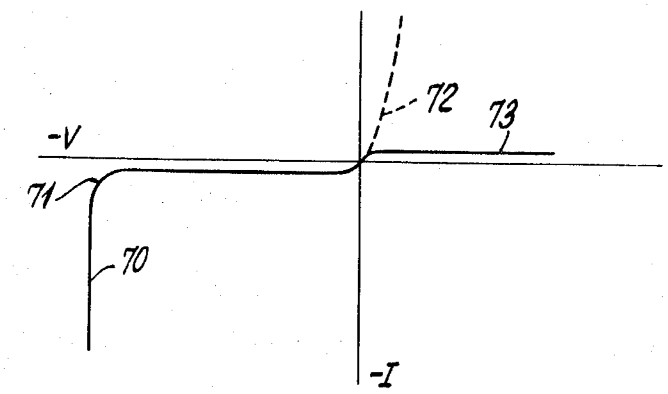

In the drawings, in which the same reference characters refer to the same parts throughout, and in which is disclosed such a practical construction:

FIG. 1 is a schematic circuit wiring diagram of an amplifier incorporating the overload protection circuit of the invention; and FIG. 2 is a chart of voltage vs. current for the Zener diode utilized in the circuit of FIG. 1.

The overload protection circuit of the present invention will be described in conjunction with one particular type of push-pull transistor power amplifier adapted to be utilized with a loudspeaker. The protection circuit is utilized to protect the driver stage and the output stage of the amplifier stage of the amplifier during overload conditions. However, it is to be noted that this particular use is for illustrative purposes only and is not to be interpreted as being a limitation of the present invention. That is, it will be obvious to those skilled in the art that the overload protection device here to be described may be utilized to protect other types of push-pull transistor amplifiers used with loudspeakers which may be subject to currents in excess of the rated current of the amplifier.

A push-pull transistor power amplifier utilizing the overload protection circuit of the present invention is designated generally by the numeral 10 in the FIG. 1, and includes a first section having a driver transistor stage or variable impedance $Q_1$ and a power transistor amplifier output stage $Q_3$, which is similarly a variable impedance. The driver transistor $Q_1$ includes a base or control electrode 12, an emitter or input electrode 14, and a collector or output electrode 16. Similarly, the output power transistor $Q_3$ includes a base or control electrode 18, an emitter or input electrode 20 and a collector or output electrode 22. Transistors $Q_1$ and $Q_3$ are shown as being NPN transistors. Connected to base electrode 12 by a lead 24 is one end of a current limiting impedance 26. The other end of impedance 26 is connected, by a lead 30, to the load $r_L$ of a loudspeaker.

The positive terminal of a biasing source of potential 28 is connected to collector electrodes 16 and 22 of the respective transistors $Q_1$ and $Q_3$ by a lead 44. The negative terminal of source 28 is connected to grounded output terminal 51. A resistor 34 is connected between emitter electrode 14 of transistor $Q_1$ and emitter electrode 20 of transistor $Q_3$ by a lead 36. A current sensing resistor 48 is connected between connection point 52 (connected to emitter 20) and output terminal 50.

The impedance 26 consists of diode 40 and Zener diode 42 which are polarized so that the cathode of diode 40 is connected to the cathode of Zener diode 42 and the anode of diode 40 is connected to lead 24. As is well known, both diodes 40 and 42 are nonlinear elements.

The second section of the push-pull amplifier 10 is similar to the first section. The first section amplifies positive signals (with reference to ground) and the second section amplifies negative signals. In the second section, a PNP transistor $Q_2$ is shown as being used to drive the output power PNP transistor $Q_4$. The second section includes an impedance 26′ which consists of Zener diode 42′ and diode 40 with the cathode of diode 40′ connected to the cathode of Zener diode 42′. The second section also includes a current sensing resistor 48′, a resistor 34' and a potential source 28'. Diodes 40 linearize the operation on each half of the amplifier by insuring that networks 26 begin to shunt current from the respective transistors at the same point on the curves.

In the second section the anode of the Zener diode 42' is connected to the base of transistor $Q_2$, the emitter 14' of transistor $Q_2$ is connected to the first terminal of resistor 34'the collector of transistor $Q_2$ is connected to the collector of transistor $Q_4$, the collector of transistor $Q_4$ is connected to the negative terminal of potential source 28', the emitter of transistor $Q_4$ is connected to the second terminal of resistor 34' and to the first terminal of resistor 48', the second terminal of 48' is connected to output terminal 50, and the anode of diode 40' is also connected to the output terminal 50.

The input signal to amplifier 10 is taken between the input terminals 60 and 62 from signal source 61. The second input terminal 62 of signal source 61 is connected to ground.

The impedance 26 in the first section, and the similar impedance 26' in the second section, utilize the series connection of a Zener diode 42 and a reverse poled high-speed diode 40. The graphical representation 70 of the action of a Zener diode is given in FIG. 2. It is seen that the breakdown voltage 71, i.e., the voltage at which current flows, is quite sharp. Zener diodes are available with dissipation of over 50 watts. The Zener diode has the effect of a high impedance (resistance) up until a certain predetermined voltage (the "-breakdown" voltage). At that voltage the effective resistance of the Zener diode drops and permits the passage of current. The high-speed diode 40 is used to increase speed and insure that operation is only on the knee region of the Zener diode 42, see FIG. 2. The diode 40 eliminates the possibility of action on the original positive portion 72 of the Zener diode characteristic and forms a new positive characteristic 73. An alternative to the Zener diodes 42–42' and the reverse poled diodes 40–40', to form impedances 26–26', is the series of diode PN junctions, for example about ten, which may be in an integrated circuit.

The maximum permissible output transistor collector current may be adjusted by choice of the value L. resistors 48 and 48'where $R_x$ equals the value of one of the resistors 48 or 48', in the following manner:

$$R_x=\frac{V\ \text{Zener}+Vd-VBE_{\text{driver}}-VBE_{\text{output}}}{IC_{\text{driver}}+IC_{\text{output}}\ (\text{max.})}$$

where:

V Zener = Zener voltage

Vd = forward voltage knee of high-speed diode $VBE_{driver}$ = base emitter voltage for maximum driver collector current $VBE_{output}$ = base to emitter voltage for maximum permissible output transistor collector current A resistor 48 is connected by a lead 52 between emitter electrode 20 of transistor $Q_3$ and an output terminal 50. The load for amplifier 10 is represented schematically as a resistor $R_L$ which is connected between output terminal 50 and an output terminal 51 which is connected to ground. Resistor $R_L$ represents the load of a loudspeaker. The negative terminal of biasing source 28 is connected to grounded output terminal 51 by a lead 54. Accordingly, load $R_L$ is connected between the emitter and collector electrodes of transistor $Q_3$ in series with the source 28.

A single-pole single-throw switch 60 is shown as being connected in parallel with load $R_L$. Normally, switch 60 will be eliminated in any conventional circuit. However, switch 60 is utilized herein to indicate conditions when a short circuit or overload condition arises in amplifier 10, as when switch 60 is closed.

In the circuitry here considered, impedance 26 junction of driver transistor $Q_1$. The shunt arm impedance 26 provides an alternative path for a portion of the current flowing from the signal source to base electrode 12 of transistor $Q_1$. The impedance 26 is selected so that current flows through it only when the current flowing through sensing resistor 48 rises above a preselected level. More specifically, diodes 40 and 42 are connected in parallel with the series circuit comprising the base-emitter junctions of transistors $Q_1$ and $Q_3$ and resistor 48.

The circuit constants are so designed that when the emitter current in the sensing resistor 48 rises above a preselected value, the sum of the voltage drops across the base-emitter junction of transistors $Q_1$ and $Q_3$ and across resistor 48 is sufficient to bias Zener diode 42 so that it operates in the knee region of its curve. Accordingly, diodes 40 and 42 will begin to conduct current away, thereby decreasing the base current to transistor $Q_1$. Since the base current to transistors $Q_1$ and $Q_3$ decreases when diodes 40 and 42 are conducting, the emitter currents through transistors $Q_1$ and $Q_3$ will likewise decrease (i.e., the emitter current is dependent upon the base current). Hence resistor 48 and diodes 40 and 42 provide a means for limiting the maximum current flowing through driver transistor $Q_1$ and output transistor $Q_3$, thereby to prevent damage to those transistors. Transistors $Q_1$ and $Q_3$ will be protected under overload conditions.

If it is assumed that switch 60 is closed so that load $R_L$ is shorted, excessive currents will tend to start to flow in the emitter-collector path of transistors $Q_1$ and $Q_3$. This will cause a greater current to flow through the base electrodes of transistors $Q_1$ and $Q_3$. In the absence of the protection circuit of the present invention, the current flowing through emitter electrodes 14 and 20 would be excessive. This excessive demand of current would cause a very high-power dissipation of transistors $Q_1$ and $Q_3$ which may result in their permanent damage. However, because of the self-regulating features of the protection circuit provided, a portion of this excessive current is shunted through impedance 26 and about transistors $Q_1$ and $Q_3$. The excessive current is applied directly to the load $R_L$ when the current in emitter electrodes 14 and 20 rises above the preselected value, thereby safeguarding transistors $Q_1$ and $Q_3$. As a result of the protection circuit here provided, the current flowing through the base electrode 18 of transistor $Q_3$ during overload conditions is no longer dependent upon the beta value of transistor $Q_1$.

The operation of the amplifier under an overload condition has been described only in reference to the first section of the amplifier, which amplifies positive signals. A similar protection against overload, and similar operation under overload conditions, exists in the second section. In the second section, the impedance 26' shunts excessive current about transistors $Q_2$ and $Q_4$ and applies it to the load $R_L$.

Accordingly, an overload protection circuit has been provided for an amplifier which is operative to protect driver and power transistors from excessive currents and to prevent the damage and burning out of such transistors.

Many other changes could be effected in the particular constructions, and in the methods of use and construction, and in specific details thereof hereinbefore set forth without substantially departing from the invention intended to be defined herein, the specific description being merely of embodiments capable of illustrating certain principles of the invention.

For example, as one alternative, the shunt arm impedance, including the Zener diode, may be connected between the base of the first (driver) transistor and the base of the second (power) transistor in each section. The sensing resistor may be connected between the emitter of the first (driver) transistor and the base of the second (power) transistor. The sensing transistor is connected so that it would forward bias the shunt arm impedance in the event of overloads. That arrangement, however, protects only the driver transistor.

As another alternative, the shunt arm impedance may be arranged to protect only the second (power) transistor. The circuit, in the case, may have the shunt arm impedance connected between the base of the second (power) transistor and the load and the sensing resistor may be connected in the emitter circuit of the second (power) transistor. As still another alternative, a warning bulb may be connected with one or both of the Zener diodes. The bulb would be activated, when the Zener diode breakdown voltage is exceeded, to warn of an overload.

What I claim is:

1. A push-pull amplifier adapted to be connected by means of two terminals to a loudspeaker, said amplifier including two sections, each section including a driver transistor having an emitter electrode, a collector electrode and a base electrode; a power output transistor having a collector electrode, an emitter electrode and a base electrode; biasing means for biasing said driver and power transistors; means for connecting the collector electrodes of said driver and power transistors; means for connecting the emitter electrode of said driver transistor and the base electrode of said power transistor; the emitter of said power transistor being connected to one of said terminals and the collector of said power transistor being connected to the other of said terminals; means for supplying a signal between the base electrodes of said driver transistors and said one terminal; and protection means including a nonlinear element between the base electrode of said driver transistor and said one terminal; a sensing impedance connected in series with the emitter electrode of said power transistor and said one terminal; said protection means being responsive to the current flowing through said sensing impedance for shunting a portion of the current flowing to the base electrode of said driver transistor about said two transistors.

2. An amplifier as in claim 1, wherein said nonlinear element is a Zener diode.

3 An amplifier as in claim 2, wherein said protection means further includes at least one high-speed diode connected between said Zener diode and said control electrode and being reversely poled in relationship to said Zener diode.